United States Patent [19]
Teschner

[11] Patent Number: 5,192,894
[45] Date of Patent: Mar. 9, 1993

[54] DEVICE FOR THE SUPPRESSION OF ARCS

[75] Inventor: Götz Teschner, Gelnhausen, Fed. Rep. of Germany

[73] Assignee: Leybold Aktiengesellschaft, Hanau, Fed. Rep. of Germany

[21] Appl. No.: 807,278

[22] Filed: Dec. 13, 1991

[30] Foreign Application Priority Data

Aug. 20, 1991 [DE] Fed. Rep. of Germany ....... 4127504

[51] Int. Cl.$^5$ .............................................. H05H 1/24
[52] U.S. Cl. .......................... 315/111.21; 313/231.31; 313/231.41; 204/298.41
[58] Field of Search ...................... 315/111.21, 111.71, 315/111.81; 313/231.31, 231.41; 250/426; 204/192.38, 298.41

[56] References Cited

U.S. PATENT DOCUMENTS

| | | | |
|---|---|---|---|
| 3,909,664 | 9/1975 | Waskiewicz et al. | 315/111.21 |
| 4,648,952 | 3/1987 | Savou et al. | 204/298.41 X |
| 4,733,137 | 3/1988 | Dunham | 315/111.21 |
| 4,786,844 | 11/1988 | Farrel et al. | 315/111.21 |
| 4,935,661 | 6/1990 | Hernecke et al. | 315/111.21 X |
| 4,936,960 | 6/1990 | Siefkes et al. | 204/192.38 |
| 5,025,135 | 6/1991 | Gesche et al. | 204/298.03 X |
| 5,037,522 | 8/1991 | Vergason | 204/298.41 |
| 5,053,725 | 10/1991 | Gesche et al. | 333/17.3 |

FOREIGN PATENT DOCUMENTS 3548494 5/1987 Fed. Rep. of Germany.

OTHER PUBLICATIONS

"The MDX as a Strategic Tool in Reducing Arcing", by Douglas S. Schatz in 1985.

Primary Examiner—Joseph A. Popek
Assistant Examiner—D. Hyum Yoo
Attorney, Agent, or Firm—Koda and Androlia

[57] ABSTRACT

The invention relates to a circuit configuration for the suppression of arcs in a plasma wherein to the plasma path (5, 7, 8) a voltage (11) is applied. The instantaneous value of the voltage of the plasma path (5, 7, 8) is compared with a mean value of the voltage which has been determined over a given period of time. If the difference between the instantaneous value and mean value exceeds a given amount, the plasma path (5, 7, 8) is isolated from the voltage (11).

6 Claims, 1 Drawing Sheet

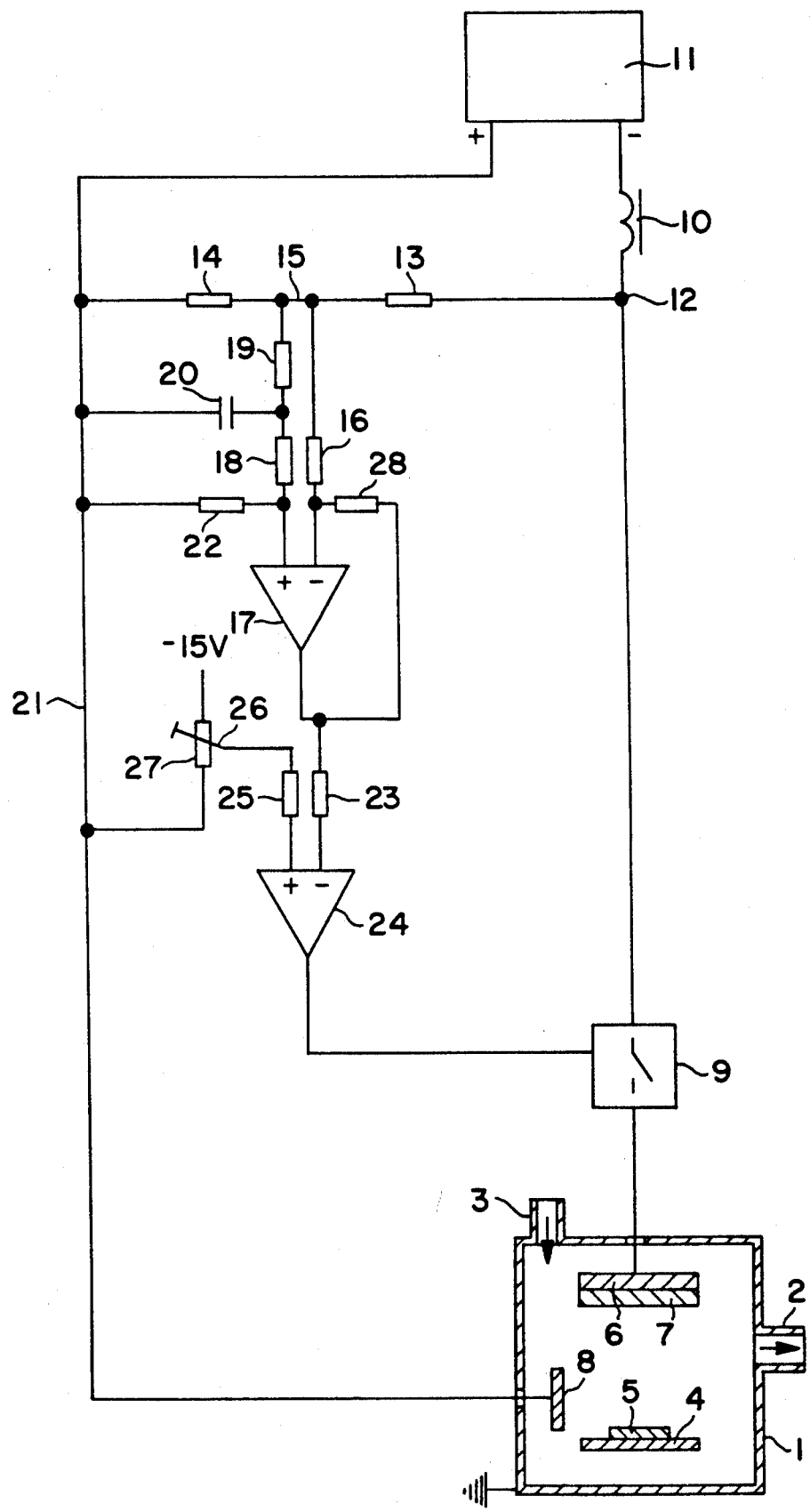

DEVICE FOR THE SUPPRESSION OF ARCS

The invention relates to an arc suppression circuit according to the preamble of patent claim 1.

In gas discharge technique it is often required to generate a plasma from a gas without causing arc discharges. For example, in the coating of glass in which $SiO_2$ is applied by sputtering onto a carrier material, a so-called substrate, no flashovers must occur because otherwise the target as well as also the substrate are destroyed. Because of the numerous physical causes which can lead to an arc discharge it is extremely difficult to prevent the arc discharge as such. However, it is possible to suppress the formation of an arc discharge of high current strength.

As closer investigations of arc discharges have shown not all discharges lead to the immediate breakdown of the insulating capability. Rather, voltage traces occur in which the breakdown of the arc firing voltage takes place a few milliseconds after a first return of the voltage to 150 to 300 V. These voltage breakdowns developing in stages are not recognized by simple oscillating circuits which are customarily used for quenching. Due to their long burn time and their high energy content connected therewith the multistage arcs lead rapidly to the destruction of the target surface.

In a known cathode arc coating method in which an arc impinges on a target and there knocks out charged particles which reach a substrate, the impedance between the electrodes between which the arc forms decreases very strongly. In order to increase this impedance again at the end of a working process it is known to draw off with an appropriate electrical potential the particles knocked out of the target more strongly in the direction of the substrate (U.S. Pat. No. 4,936,960). However, the disadvantage of this known method is that it can only be applied in the case of arc coatings as well as direct current between the arc electrodes, on the one hand, and the target or substrate, on the other.

It is furthermore known upon the occurrence of an arc discharge to supply an installation with the least amount of energy possible or to suppress the energy supply entirely. Therein the energy supply is to remain suppressed until the entire zone around the arc discharge has become stabilized (D. S. Schatz, The MDX as a Strategic Tool in Reducing Arcing, Publication of the Advanced Energy Industries, Inc., 1985). A further known measure for decreasing the probability of arcing resides in decreasing the ripples of the energy supply and specifically over the entire impedance range. Application of faster regulating devices has also been suggested in order to adapt rapidly the deviations from the nominal value of the supply voltage (D. S. Schatz, op.-cit.). To quench arcs a reversing circuit has been suggested such as is customary in the thyristor technique.

The invention is based on the task of creating an improved circuit configuration for quenching arcs in plasma arrangements.

This task is solved according to the features of patent claim 1.

The advantage achieved with the invention resides in particular therein that even when sputtering difficult materials, for example $SiO_2$, high coating rates are possible because the sputtering process is only interrupted for a very short time. When sputtering $SiO_2$, Si atoms are knocked out from a target of highest grade silicon disposed in an argon/oxygen atmosphere of $10^{-3}$ to $10^{-1}$ mbars, which combine with oxygen to form $SiO_2$ which is deposited on a substrate.

The arc formation can, as experiments have shown, occur specifically so that after a first voltage return the cathode voltage remains for several milliseconds at a voltage value of approximately 250 V. This voltage value is still within the acceptable operating range of the cathode. After that the cathode voltage breaks down to an arc value of 30 to 50 V. This intermediate stage is physically interpreted with the build-up of a charge carrier cloud at the cathode. The formation of a complete arc leads to local heating of the cathode surface and, consequently, of the target which is also referred to as "hot spot". In order to continue making possible the sputtering operation this hot spot must have cooled before the cathode voltage is switched on again so that it cannot effect thermal emission of electrons. The sooner an arc is recognized and the cathode current switched off, the less is the probability that significant heating occurs.

With the invention an arc can be recognized and signaled to a switching device before the current strength in the arc has increased so much that damages in the target and/or substrate area can occur such as for example material splashes from target to substrate or splits off the target. Since no fixed limits for current and voltage are monitored in the invention, but rather the change of the voltage over time is checked, considerably earlier recognition of the arc is possible.

An embodiment example of the invention is depicted in the drawing and will be described in the following in further detail.

The single FIGURE shows the principle of a sputtering installation with the circuitry according to the invention.

In a vacuum chamber 1 having a port 2 for evacuating this chamber 1 and a port 3 for the feed of gases is located a substrate holder 4 on which is disposed a substrate 5. The substrate 5 comprises for example glass or is a synthetic film or a silicon wafer of microelectronic fabrication. The vacuum chamber 1 comprises preferably metal and is at ground. Opposing the substrate 5 is a cathode 6 with a target 7. The associated anode 8 is disposed laterally to substrate 5.

Via a switch 9 and a choke 10 an electrical connection is carried from the cathode 6 to the negative output of a dc voltage source 11. The positive output of this dc voltage source 11 is connected with the anode 8.

To a junction point 12 between choke 10 and switch 9 is connected a resistor 13 which is connected with a second resistor 14 which, in turn, is connected with the cathode and the positive output of the voltage source 11. To the connecting line 15 between the two resistors 13, 14 a further resistor 16 is connected which is connected to a first input terminal of a differential amplifier 17. The second input of this differential amplifier is connected via a resistor 18 and a resistor 19 likewise to the connecting line 15. A capacitor 20 is connected with its one terminal to the connecting line between resistor 19 and resistor 18 and with its other terminal to the connecting line 21 between the positive output of the voltage source 11 and the anode 8. To the same connecting line 21 is connected a resistor 22 which is connected with the second input of the differential amplifier 17. The output of the differential amplifier 17 leads via a resistor 23 to an input of a further differential amplifier 24 whose further input is connected via a resistor 25 with the tap 26 of a potentiometer 27. This potentiometer 27 is, on the one hand, connected to the negative terminal of a dc voltage source of, for example 15 V, and, on the other hand, to the line 21. The output of the differential amplifier 17 is fed back via a resistor 28 to the negative input of this amplifier 17.

The choke 10 serves the function of increasing the dynamic impedance of the dc voltage source 11 so that the cathode current can increase only insignificantly within a given time interval.

With the aid of switch 9 it is possible to interrupt the cathode current if an actual or developing arc discharge is detected. The switch 9 can also be a component part of the voltage source 11 or can be disposed between the voltage source 11 and the choke 10. Moreover, instead of an isolation of the voltage source 11 from the cathode it could also effect a shortcircuit between anode 8 and cathode 6.

The two resistors 13, 14 represent a voltage divider while the resistor 19 represents, together with the capacitor 20, an RC element which integrates the cathode voltage decreased to a processable level. The integration time constant resulting from the mathematical product of the resistance of resistor 19 and the capacitance of capacitor 20 is selected so that at a given lower limit value for the slope of the voltage drop and at a fixed minimal length of time of the voltage drop the signal level set for triggering the switch 9 is obtained.

The voltage integrated at capacitor 20 is compared by means of conventional differential amplification circuits 16, 17, 18, 22, 28 with the actual voltage value. The output voltage of the differential amplifier 17 is evaluated with a conventional trigger circuit 23, 24, 25. If the trigger switching point is exceeded, switch 9 is triggered.

For the function of the circuit configuration according to the invention it is insignificant whether, as shown, the anode 8 and the substrate carrier 4 are electrically isolated from one another or electrically connected with one another or are identical. It is also unimportant whether anode 8 and substrate carrier 4 are both or only one of the two at the final potential of the vacuum chamber 1.

The lower limit value for the slope of the drop of the cathode voltage is defined as 2 V/us, the minimum interval as 5 us.

As can be recognized on the basis of the above description through the circuit configuration according to the invention not a simple du/dt evaluation is carried out because a classical differential circuit with a coupling of the alternating current component of the cathode voltage via a capacitor does not lead to success. Rather through a pure differential circuit the appearance of the cathode voltage would be so "roughened up" that the natural fluctuations in the sputtering process due to the covering of the electrodes and irregularities in the gas flow and substrate motions would cause a multiplicity of error arc messages. With the present invention, in contrast, the mean value of the cathode voltage is compared with the instantaneous value of the cathode voltage and an arc signal is output only if a dynamic limit value is exceeded.

Expressed differently: over a period of approximately 5 us the mean value of the cathode voltage is formed. If this mean value for example is more negative by 10 V than the currently present cathode voltage, switch 9 is actuated.

Criterion for the switching action consequently is exceeding a threshold value of the difference voltage formed from the instantaneous voltage minus the mean value of the voltage which is continuously formed over a defined period of time.

Since all process-dependent changes and fluctuations proceed over greater periods of time than the mean value formation, the mean value of the cathode voltage follows these fluctuations.

I claim:

1. Circuit configuration for the suppression of arcs in a plasma wherein to a plasma path a voltage source is connected, comprising a means for sensing an instantaneous value of the voltage of the plasma path, a means for generating a mean plasma voltage determined over a given time and a means for comparing said instantaneous value of the voltage of the plasma path with the mean plasma voltage and for isolating said voltage source (11) from said plasma path if the difference between the instantaneous value of the plasma voltage and the mean plasma voltage exceeds a given value.

2. Circuit configuration as stated in claim 1, characterized in that the means for generating the mean plasma voltage determined over the given time comprises an integration element (19, 20) whose time constant is selected so that at a given lower limit value for a slope of a voltage drop and at a defined minimum length of time of the voltage drop a signal level required for the triggering of a switch isolating the voltage source (11) is reached.

3. Circuit configuration as stated in claim 2, characterized in that the mean plasma voltage from the integration element is suppled to an input of a differential amplifier (17) and the instantaneous value of the plasma voltage is applied to an other input of the differential amplifier.

4. Circuit configuration as stated in claim 3, characterized in that the output signal of the differential amplifier (17) is placed onto an input of a further differential amplifier (24) which functions as a trigger and to whose other input is provided said given value.

5. Circuit configuration as stated in claim 4, characterized in that the output of the further differential amplifier (24) is connected with the switch (9) disposed between the voltage source (11) and an electrode (6) of the plasma path.

6. Circuit configuration as stated in claim 5, characterized in that between the voltage source (11) and the switch (9) a choke (10) is connected.

* * * * *